United States Patent [19]

Matheny

[11] Patent Number: 4,773,088
[45] Date of Patent: Sep. 20, 1988

[54] TELEPHONE AMPLIFIER WITH SWITCHABLE GAIN CONTROL

[75] Inventor: Mark Matheny, Manchester, Conn.

[73] Assignee: Tek Electronics Manufacturing Corporation, Manchester, Conn.

[21] Appl. No.: 830,635

[22] Filed: Feb. 18, 1986

[51] Int. Cl.$^4$ ............................................. H01M 1/60
[52] U.S. Cl. ...................................... 379/395; 379/52
[58] Field of Search ............... 179/6.3 R, 100 L, 167, 179/183; 381/68, 102, 104, 109; 379/52, 395; 455/232, 233, 253

[56] References Cited

U.S. PATENT DOCUMENTS

| | | | |
|---|---|---|---|
| 2,574,887 | 11/1951 | Pye | 179/167 X |
| 2,581,251 | 1/1952 | Glazer et al. | 179/183 |
| 3,144,513 | 8/1964 | Sherron | 179/183 |
| 3,254,160 | 5/1966 | Day et al. | 179/167 |
| 3,902,398 | 9/1975 | Nakada et al. | 381/109 |
| 4,151,376 | 4/1979 | Walker, Jr. | 179/100 L |
| 4,363,934 | 12/1982 | Scholz | 381/109 |
| 4,385,204 | 5/1983 | Wine | 381/109 |
| 4,466,120 | 8/1984 | Walker, Jr. et al. | 179/81 B |
| 4,568,803 | 2/1986 | Frola | 179/183 |
| 4,608,462 | 8/1986 | Blomley et al. | 379/390 |

OTHER PUBLICATIONS

Mims, Forrest M., III, "Engineer's Notebook II", ©1982 by Radio Shack, p. 120.

Primary Examiner—Robert Lev
Attorney, Agent, or Firm—McCormick, Paulding & Huber

[57] ABSTRACT

An amplifier for controlling the volume in a telephone instrument of the general type including coin-operated and pay type telephone instruments is enclosed in the telephone housing and provides a number of discrete, predetermined amplification levels selectable by operating a push-button switch also located in the housing so that its plunger extends through an opening in the telephone instrument face. The amplification level is automatically restored to a volume associated with a normal hearing sensitivity at the start of a new call and a dial shunt circuit suppresses the DTMF tones heard by a user when tone dialing is used.

10 Claims, 3 Drawing Sheets

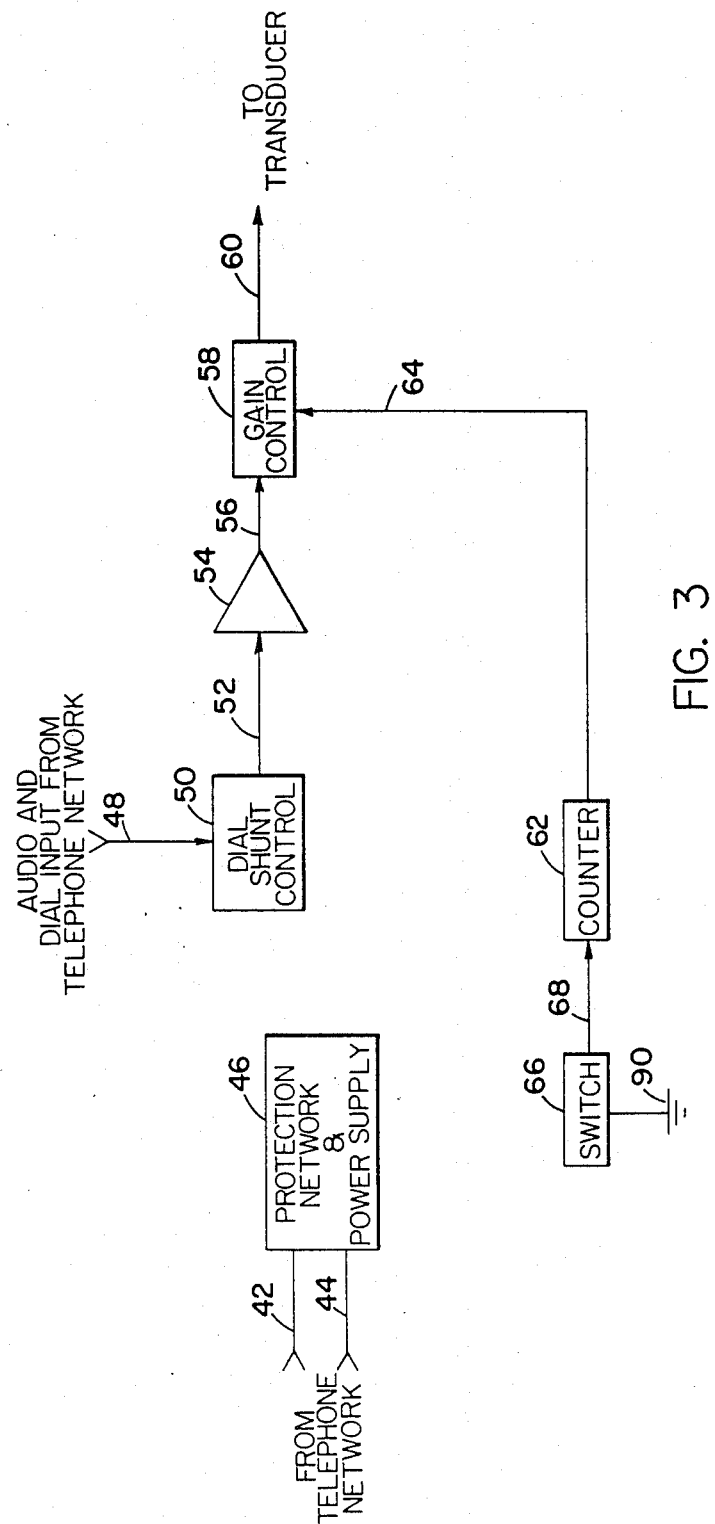

TELEPHONE AMPLIFIER WITH SWITCHABLE GAIN CONTROL

BACKGROUND OF THE INVENTION

The present invention relates generally to an amplifier for use in a telephone instrument to increase the volume of received audio signals to aid the hearing impaired and those with normal hearing sensitivity when the telephone is located in environments with high ambient noise levels and deals more specifically with a push-button operated switchable gain control amplifier for use with coin-operated and pay type telephone instruments.

It is well known to provide a telephone amplifier in the handset of a conventional telephone to vary the amplitude of audio signals received from the telephone subset. Generally, an amplifying receiver and a volume control in the form of a potentiometer are located in the handset and a user varies the receiver volume to suit the user's need by rotating the potentiometer. A handset amplifier of the above described general type is disclosed in U.S. Pat. Nos. 4,151,376 and 3,254,160. Another telephone handset amplifier disclosed in U.S. Pat. No. 4,466,120 utilizes a rocker switch located in the handset to control the amplifier to vary the receiver volume.

One problem generally associated with the handset type amplifiers is the volume control potentiometer is often difficult to operate especially for users with a physical handicap or impaired hand and finger movement or limited dexterity, for example, due to arthritis.

Another problem associated with handset type amplifiers is that the volume level set by a previous user may be too loud for the current user possibly subjecting the current user to hearing damage or other uncomfortable hearing sensations if the volume is not reduced prior to the start of the call. Consequently, to avoid such hearing discomfort, a user must remember to check the setting of the volume control at the beginning of the call.

Yet another problem associated with handset amplifiers is the relatively high cost associated with the replacement of a damaged or missing handset. Such replacement costs can be significant especially when the amplifier handset is used with coin-operated or pay type telephone instruments which are frequently located in an environment subject to repeated vandalism wherein the vandalism takes the form of ripping the handset and cord from the telephone housing.

It is desirable therefore to provide a telephone amplifier for use with a coin-operated or pay type telephone instrument wherein the amplifier is located within the telephone instrument housing rendering it relatively vandal proof and thus substantially reducing the cost of handset replacement.

It is also desirable to provide a telephone amplifier that is readily adjustable by a user having a physical handicap or other physical limitation.

An object of the present invention is, therefore to provide a telephone amplifier for use with a coin-operated or pay type telephone instrument that overcomes the above described problems associated with conventional handset amplifiers.

SUMMARY OF THE INVENTION

In accordance with the present invention, a telephone amplifier for controlling the volume in a telephone instrument of the general type including coin-operated and pay type telephone instruments is presented wherein the telephone amplifier is located within the telephone housing so as to be sustantially vandal proof. The amplifier is coupled to the telephone subscriber line by input coupling means to receive electrical signals representative of audio speech. Circuit means connected to the input coupling means receive the electrical signals from the telephone line and include amplifier means for amplifying the magnitude of a received electrical signal wherein the amplifier means provides a number of discrete, predetermined amplification levels. The output of the amplifier means is coupled to transducer means which may be within the telephone instrument or handset to excite the transducer in proportion to the magnitude of the received electrical signals to cause the tranducer to convert the signals to audio or speech.

The invention further resides in amplification selection means for slecting one of the discrete amplification levels. The selection means is electrically coupled to actuator means and is sensitive to and responsive to the operation of the actuator means to select a desired one of the amplification levels.

A feature of the invention is that the actuator means resides in a push-button type switch having its body mounted within the telephone instrument housing and includes a plunger extending through an opening in the face of the telephone instrument housing whereby a desired amplification level is selected by simply pushing the plunger to change the volume of the received signal.

Another feature of the invention is that the amplification level and consequently, the volume of a received signal is automatically reset at the initiation of each new call to a volume generally associated with a normal hearing sensitivity.

BRIEF DESCRIPTION OF THE DRAWINGS

Other features and advantages of the present invention will be readily apparent from the following written description and claims taken together with the drawings forming a part thereof wherein:

FIG. 3 is a functional block diagram showing the interconnection of the major operational elements comprising the amplifier.

DETAILED DESCRIPTION OF THE PREFERRED EMBODIMENIS

Figure 1:
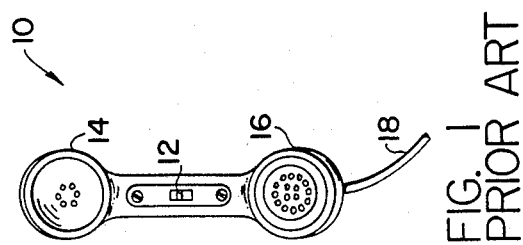
FIG. 1 is a diagrammatic view of a conventional telephone instrument handset containing a handset amplifier of the type generally found in the prior art.

Referring to the drawings and considering FIG. 1 in particular, a conventional telephone instrument handset containing a handset amplifier of the type used in the prior art is shown therein and designated 10. The handset 10 is attached to a telephone instrument by a cord 18 and includes a potentiometer 12 mounted in the handset handle between the earpiece 14 and the transmitter 16. The potentiometer 12 is connected to an amplifier located within the handset housing and is used to adjust the volume of a received call. In one prior art embodiment illustrated in U.S. Pat. No. 4,151,376, the amplifier is mounted within the housing and is connected the earpiece 14.

Figure 2:
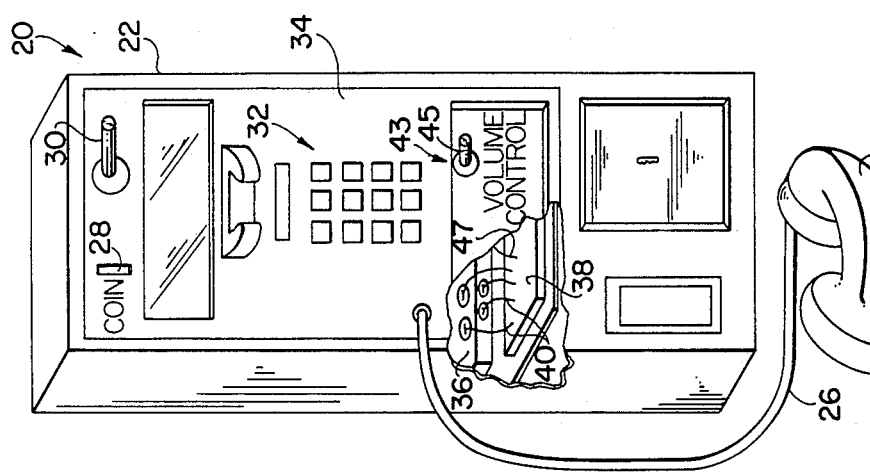
FIG. 2 is a perspective view of a coin-operated telephone instrument of the type with which the telephone amplifier of the present invention may be used and illustrates the push-button volume control switch. The telephone housing is shown partially cut away to reveal the circuit board containing the electronic components comprising the amplifier.

Turning now to FIG. 2, a coin-operated telephone instrument of the general type with which the amplifier of the present invention may be used is shown therein and designated 20. The telephone 20 includes a housing 22, generally of a metal construction, and a conventional handset 24 connected to the telephone instrument and a transmission and balancing network within the telephone instrument by a cord 26. The transmsssion network may be one of a number of different types and is generally well understood by those skilled in the telephone transmission art. The telephone 20 further includes a coin slot 28, a coin release 30 and a touch dialing pad shown generally at 32 and located on the face 34 of the telephone instrument. A portion of the telephone instrument 20 is cut away to reveal a terminal connecting block 36 which is used as a connection point for the various components comprising the telephone instrument. A circuit board or module 38 containing the components comprising the amplifier of the present invention is connected to the terminal block 36 by leads 40,40.

A volume control 43 comprises a momentarily operated push-button type switch mounted within the telephone housing 22 and has an actuator plunger 45 extending through an opening in the face 34 of the telephone instrument 20. The volume control 43 is connected to the amplifier 38 by leads 47 to cause a desired one of the amplification levels to be selected when the switch 43 is operated.

The telephone instrument 20 is also connected to telephone subscriber lines in a conventional manner to send and receive electrical signals representative of audio, speech and call supervision. The audio or speech is generally converted typically by a carbon microphone in the transmitter of the handset, to electrical signals which are coupled to the telephone subscriber line. Received electrical signals are converted to audio by a receiving transducer generally located in the earpiece of the handset. The operation of the transmitter and receiving transducer are generally well known in the art and a further understanding of their operation is not essential to the disclosure of the telephone amplifier of the present invention.

Turning now to FIG. 3, a functional block diagram of the major operational elements comprising the amplifier is shown therein. Electrical power to operate the amplifier is provided from the telephone subscriber line which is coupled to the telephone transmission network via leads 42,44 whenever the telephone instrument is OFF-HOOK, that is, when the handset is removed from its ON-HOOK position. A network represented by function block 46 provides polarity protection by maintaining the proper polarity voltage to the elctrical components during tip-to-ring voltage phase reversals that occur with toll call supervision. The network 46 further includes an over-voltage protection device to limit to a predetermined voltage level voltage transients which may appear on the telephone line and which level is less than a voltage that would cause damage to any of the components.

Electrical signals represnntative of audio and dialing information are coupled from the telephone transmission network to the amplifier on lead 48. The signals appearing on lead 48 are fed to a dial shunt control circuit 50 which is responsive to the activation of the telephone touch pad dial and suppresses the magnitude of the tone signals fed to the input 52 of an amplifier 54. The supressed tones are prevented from being amplified beyond a very low level and consequently the volume of the tones heard by the user during the dialing process is very low.

The signals fed to the dial shunt control circuit 50 are shaped somewhat prior to being fed to the input 52 of the amplifier 54 to limit the low frequency response of the amplifier. The amplifier 54 is generally a high gain operational amplifier and its output 56 is fed to an output gain control circuit 58. The gain control circuit 58 regulates the magnitude of the amplified signal to a desired level prior to outputting the signal on lead 60.

The output gain control circuit 58 is coupled to a binary counter 62 by a control lead 64 and in response to the output count address of the binary counter provides a desired one of a number of discrete amplification levels. The output of the binary counter 62 changes its output count in response to the operation of a switch 66 coupled between a clock input 68 of the binary counter 62 and a common reference or ground potential 90. The counter 62 output count sequences one count each time the switch 66 is operated and each count output is associated with a discrete amplification level.

Figure 4:
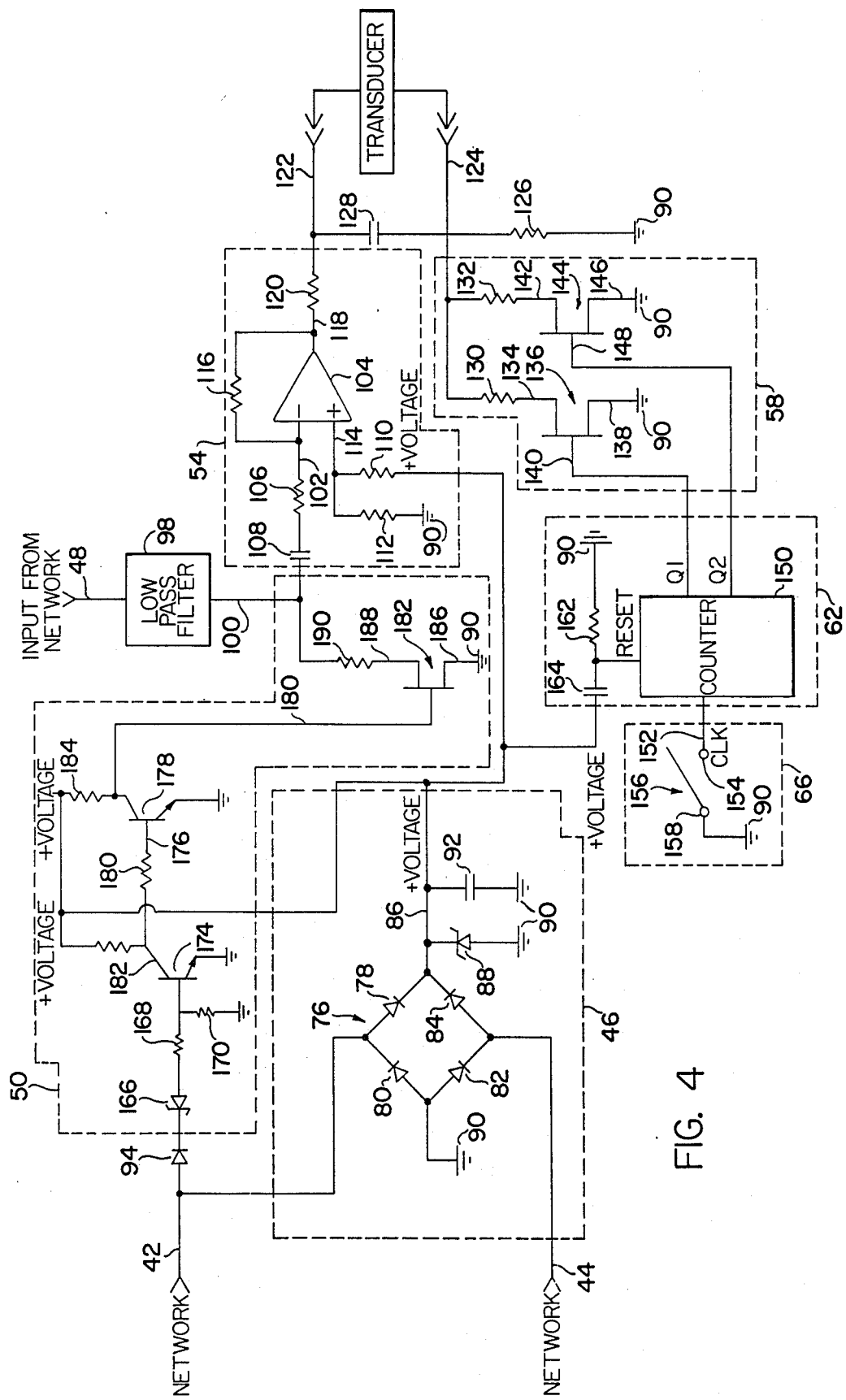
FIG. 4 is an electrical circuit schematic diagram illustrating one embodiment of the telephone amplifier of the present invention.

Referring now to FIG. 4, an electrical circuit schematic diagram showing the major electrical components comprising one embodiment of the telephone amplifier of the present invention is shown therein. It will be understood that the specific circuit design may vary as a direct result of the designers choice of electrical components and type. Preferrably, the amplifier of the present invention is implemented using electrical components having a low power consumption requirement such as, for example, devices designed and fabricated using CMOS technology to minimize power consumption and current drawn from the telephone subscriber line.

The amplifier of FIG. 4 is effectively coupled to the Tip and Ring of a telephone subscriber line through the telephone instruments transmission network by input leads 42, 44. When the telephone instrument is in an OFF-HOOK condition, current is provided through the input lead 42 which is connected to a standard diode bridge 76. The bridge 76 comprises diodes 78,80,82 and 84 arranged in a standard full wave bridge configuration and lead 42 is connected to the junction formed by the anode of diode 78 and the cathode of diode 80. Current flows, in the OFF-HOOK condition, through a forward biased diode 78 to provide a positive voltage on lead 86. The positive voltage is connected to the various circuit components of the amplifier and is indicated as "+ voltage" in the diagram of FIG. 4.

A zener diode 88 is coupled between the positive voltage lead 86 and a common reference or ground potential designated 90 to clamp voltage transients that may occur on the telephone subscriber line to a predetermined voltage level to prevent damage to the various circuit components. A capacitor 92 in parallel with the diode 88 acts as a filter to smooth voltage fluctuations present on the positive voltage lead 86.

The diode bridge 76 also provides protecticn for the amplifier electrical components against voltage polarity phase reversals which appear across the Tip-to-Ring during toll call supervision. The input terminal lead 42 is also connected to the anode of diode 94 and the diode 94 functions to protect the components comprising the dial shunt control circuit from damage during Tip-to-Ring voltage polarity phase reversals.

Speech, dual tone multifrequency signals (DTMF) associated with touch pad calling and other audio in the form of electrical signals are input to the telephone amplifier on an input lead 48. The lead 48 is connected to the telephone transmission network and a signal on lead 48 is coupled to a low pass filter 98 which shapes the received signal.

The low pass filter 98 has an output 100 coupled to the inverting input terminal 102 of a high gain operational amplifier 104 through a resistor 106 and capacitor 108 connected in series between the output of the low pass filter and the inverting input terminal of the operational amplifier. Resistor 106 and capacitor 108 form a series R-C network to limit the low frequency response of the telephone amplifier.

A voltage divider network comprising resistor 110 and 112 is connected between the positive voltage supply and ground potential and the junction of the resistors is connected to the noninverting terminal 114 of the amplifier 104 to establish the DC bias level for the amplifier. A feedback resistor 116 is coupled between the output 118 of the amplifier 104 and the inverting terminal 102 of the amplifier. The value of the feedback resistor 116 is chosen in conjunction with the value of resistor 106 to provide an approximate amplifier voltage gain of 25.

The output 118 of amplifier 104 is coupled to an output terminal 122 through resistor 120. A receiver transducer or earpiece is connected across output terminal 122 and an output terminal 124 coupled to ground potential 90 through a resistor 126 and the receiver transducer converts the electrical signals appearing across the output terminals into audio. The value of resistor 126 is selected to cause the transducer to produce an output volume having a magnitude associated with the hearing sensitivity of a user having a hearing sensitivity generally accepted as being normal.

A capacitor 128 is connected between output terminals 122, 124 and functions as a low pass filter to limit the effects of any side tones that may be present during a telephone call.

The volume of the audio produced by the receiver transducer is controlled by adjusting the value of resistor 126. In the present invention, the value of resistor 126 is adjusted by connecting resistors 128 and 130 in parallel with resistor 126 and each other in a predetermined combination to control the output amplification level of the signal appearing across terminals 122 and 124. The resistors 130 and 132 are each connected in common at one end with one end of resistor 126. The opposite end of resistor 130 is connected to one terminal 134 of a controllable switching device 136. Another terminal 138 of the device 136 is coupled to the ground potential 90. The device 136 includes an input terminal 140 upon which a control voltage signal is impressed to control the switching state of the device. When the device 136 is in its OFF condition, it is in a high impedance state and acts effectively as an open circuit between the terminals 134 and 138. The device 136 is in a saturated or ON condition when the proper voltage signal is present on input lead 140 and appears as a short circuit between terminals 134 and 138. Consequently, the resistor 130 is connected into and out of the parallel resistive network combination comprising resistors 126, 130 and 132 to control the output amplification level of the signal appearing across terminals 122 and 124. In a similar manner, one end of resistor 132 is connected to one terminal 142 of a switching device 144 and another terminal 146 of the device 144 is connected to the ground potential 90. An input lead 148 couples an electrical signal to the device 144 to control its ON-OFF condition so that the resistor 132 is switched into and out of the parallel resistive network comprising resistors 126, 130 and 132 when the proper voltage signal is present at the input 148.

The switching device 136 has its input terminal 140 coupled to the output Q1 of a binary counter 150 and device 144 has its input terminal 148 coupled to the counter output Q2. the output Q1 of the counter is associated with the least significant bit (LSB) in a binary coded signal representative of a count and the output Q2 is associated with the most significant bit (MSB) in the count. The counter 150 has a clock input 152 which is connected to a make-contact 154 of a momentarily operated switch 156. A transfer contact 158 of the switch 156 is connected to the ground potential 90 and the clock input 152 is connected to ground each time the switch 156 is operated. The output Q1, Q2 of the counter 150 is responsive to signals present at the clock input 152 and the counter sequences one count each time the switch 156 is operated. The switching state of devices 136 and 144 is controlled by the voltage state of the counter output Q1, Q2, and consequently, the value of the resistive network comprising resistor 126, 130 and 132 is also controlled by the state of the counter and is explained below.

For the following explanation, the counter 150 output Q1 and Q2 are assumed to be in a low voltage logic state and the counter counts from a value of zero to a value of three and further that the presence of a low voltage logic state on both outputs is associated with the normal amplification level wherein only resistor 126 is connected to the output terminal 124. Upon operation of switch 156, the output of the counter 150 changes state and Q1 changes to a high voltage logic state and Q2 remains at a low voltage logic state. Since Q1 is coupled to switching device 136 through input 140, the device switches to its ON state and connects resistor 130 in parallel with resistor 136. The resistive value of the parallel combination of resistors 130 and 136 is selected to increase the volume of the audio a predetermined amount. Upon the next operation of switch 156, the output of the counter 150 sequences one count so that Q1 returns to a low voltage logic state and Q2 changes to a high voltage logic state. Since Q1 is now in a low voltage logic state, switching device 136 returns to its OFF condition and effectively removes resistor 130 from the circuit. Switching device 144 is switched to its ON condition because of the presence of a high voltage logic signal from counter output Q2 on its input terminal 148 and causes resistor 132 to be connected in parallel with resistor 126. The parallel combination of resistors 126 and 132 is selected to increase the volume a predetermined amount above the volume produced by the parallel combination of resistors 126 and 130. The subsequent operation of switch 156 again causes the counter 150 output to sequence one count and both Q1 and Q2 are at a high voltage logic level and accordingly, both switching devices 136 and 144 are switched to their ON condition. Resistors 130 and 132 are now connected in parallel with resistor 126 and each other and the parallel combination of resistors 126,130 and 132 increases the volume a predetermined amount above the volume produced by the parallel combination of resistors 126 and 132. Upon the next operation of switch 156, the counter outputs Q1 and Q2 change to a low voltage logic level. Both switching devices 136 and 144 are returned to their OFF condition effectively removing resistors 130 and 132 from the parallel combination and the volume of the audio is returned to its initial volume associated with the normal amplification level. Subsequent operation of switch 156 sequences the output count of the binary counter 150 to change the volume as explained above.

To insure that the volume is associated with the normal amplification level at the beginning of a new call, the binary counter 150 is reset when the handset is taken OFF-HOOK. The counter 150 includes a reset input 160 coupled to the junction of a series resistor 162 and capacitor 164 combination coupled between the positive voltage and ground 90. At the beginning of a new call, current flows through the resistor 162 and capacitor 164 combination to generate a reset signal on the reset lead 160 which forces the counter output Q1 and Q2 to a low voltage logic state thereby keeping switching devices 136 and 144 in an OFF condition. Consequently, the volume produced by the receiver transducer is associated with the normal amplification level because only resistor 126 is connected to the output terminal 124 when the counter output Q1 and Q2 are at a low voltage logic state.

To prevent the hearing of audio associated with the DTMF signals generated by the touchpad during dialing, a dial shunt control circuit is activated when a button is depressed on the touchpad. The circuit responds to the depression of a touch pad button and shunts the input of the amplifier 104 to ground 90 to prevent amplification of the DTMF signals that appear at the input 48 during the dialing process. A zener diode 166 coupled to the nput terminal 72 through diode 94 becomes conductive when the touchpad is operated. A positive voltage having a sufficient magnitude to cause the diode 166 to conduct is generally applied to the input 42 through contacts in the touchpad. When conductive, diode 166 conducts current from the input 42 through resistors 168 and 170 to ground 90. The junction of resistors 168 and 170 is connected to the base 172 of a transistor 174. During the operation of the touchpad, the transistor 174 becomes forward biased and couples the base 176 of a transistor 178 to ground 90 through resistor 180 and the collector 182 of transistor 174. Transistor 178 is now in an OFF condition and a positive voltage is applied to the input terminal 180 of a switching device 182 through a resistor 184 coupled between the positive voltage and the input terminal 180. The input terminal 180 is also connected to the collector of the transistor 178. The switching device 182 has one terminal 186 connected to ground 90 and has another terminal 188 connected to one end of resistor 190. The other end of resistor 190 is coupled to the input 102 of amplifier 104 through a series resistor 106 and capacitor 108. During the operation of the touchpad, switching device 182 couples the input of the amplifier 104 to ground 90 through the resistor 106, capacitor 108, resistor 190 and the switching device 182 and also shunts the DTMF signals present at the output 100 of the low pass filter 98 to ground.

A push-button operated telephone amplifier with switchable gain control for use in a telephone instrument of the coin-operated and pay type has been described in a preferred embodiment. However, it will be understood that numerous changes and modifications may be had without departing from the scope and spirit of the invention and therefore, the invention has been described by way of example rather than limitation.

I claim:

1. A telephone amplifier assembly located internally within a telephone instrument housing for controlling the volume of a handset receiver associated with a telephone instrument of the general type including coin-operated and pay type telephone instruments and characterized by transmission network means for connecting the telephone instrument to a telephone subscribers line to send and receive electrical signals representative of audio and cell supervision to and from the telephone line and the handset receiver including transducer means for converting the received electrical signals into audio, said amplifier assembly comprising:

input coupling means for coupling the amplifier assembly directly to the telephone transmission network located within the telephone housing to couple received electrical signals from the telephone subscriber line to the amplifier assembly;

circuit means connected to the input coupling means for receiving the electrical signals, said circuit means including amplifier means for amplifying the magnitude of a received electrical signal in accordance with a predetermined incremental amplification level;

gain control circuit means coupled to said amplifier means for establishing a predetermined number of said predetermined incremental amplification levels, and output coupling means for coupling the amplifier means to the handset receiver transducer to excite the transducer in proportion to the magnitude of said amplified received electrical signal wherein the volume of the audio produced is proportional to the magnitude of the amplified signal;

amplification level selection means coupled to said gain control circuit means for selecting one of said predetermined number of said incremental amplification levels, each of said incremental amplification levels being associated with a different volume, and actuator means coupled to said amplification level selection means for sequentially selecting from said predetermined number of said incremental amplification levels a different one of said number of different amplification levels each time said actuator means is operated.

2. A telephone amplifier assembly as defined in claim 1 wherein said output coupling means includes:

a first output terminal;

an output resistor connected between the output of the amplifier means and first output terminal;

a second output terminal;

said transducer being connected to and across said first and second output terminals, and a first gain resistor coupled between said second output terminal and an electrical ground reference potential, said first gain resistor and said transducer forming a voltage divider network and said first gain resistor having a value selected to produce a signal across said first and second terminals so that said signal has a magnitude to cause the transducer to produce an audio signal having a first volume corresponding to the volume generally produced for a telephone user having a normal hearing sensitivity.

3. A telephone amplifier assembly as defined in claim 2 wherein said gain control circuit means includes:

a second gain resistor having one end connected to said second output terminal and its other end connected to a first terminal of a first switching device, said first switching device having a second terminal connected to ground potential and an input terminal for controlling the switching state of the device, said switching device producing a short circuit between its first and second terminals when a voltage potential of the proper polarity is applied to its input terminal and producing a high impedance open circuit between its first and second terminals when the proper polarity voltage potential is removed from its input terminal, said second gain resistor being connected in parallel with said first gain resistor when said first switching device is in its short circuit state wheeby the magnitude of the signal appearing across said first and second output terminals is amplified a first predetermined incremental amplification level above said magnitude associated with said first volume and causing said transducer to produce an audio signal having a second volume louder than said first volume.

4. A telephone amplifier assembly as defined claim 3 wherein said gain control circuit means includes:

a third gain resistor having one end connected to said second output terminal and its other end connected to a first terminal of a second switching device, said second switching device having a second terminal connected to ground potential and an input terminal for controlling the switching state of the device, said switching device producing a short circuit between its first and second terminals when a voltage potential of the proper polarity is applied to its input terminal and producing a high impedance open circuit between its first and second terminals when the proper polarity voltage potential is removed from its input terminal, said third gain resistor being connected in parallel with said first gain resistor when said first switching device is its short circuit state whereby the magnitude of the signal appearing across said first and second output terminals is amplified a second predetermined incremental amplification level above said magnitude associated with said second volume and causing said transducer to produce an audio signal having a third volume louder than said second volume.

5. A telephone amplifier assembly as defined in claim 4 wherein said second gain resistor and said third gain resistor are connected in parallel with said first gain resistor when said first switching device and said second switching device are in their short cirucit state whereby the magnitude of the signal appearing across said first and second output terminals is amplified a third predetermined incremental amplification level above said magnitude associated with said third volume and causing said transducer to produce an audio signal having a fourth volume louder than said third volume.

6. A telephone amplifier as defined in claim 5 wherein said amplification selection means includes a binary counter having two output terminals and producing a two bit binary coded signal wherein one bit is the LSB and is associated with one output terminal and the other bit is the MSB and is associated with the other output terminal, said counter being arranged to count sequentially one count in response to each operation of said actuator means, said counter further being arranged for sequential counting from a count equal to zero to a count equal to three, said count value corresponding to the number of said incremental amplification levels where each count value is associated with a different one of said incremental amplification levels, said counter returning to a count value equal to zero when said actuator means is operated subsequently to said counter having a count value equal to three.

7. A telephone amplifier as defined in claim 6 wherein the LSB output terminal is coupled to the input terminal of said first switching device and the MSB output terminal is coupled to the input terminal of said second switching device.

8. A telephone amplifier as defined in claim 6 wherein said binary counter is reset to a count value equal to zero at the initiation of a telephone call.

9. A telephone amplifier as defined in claim 1 wherein said actuator means comprises a momentarily operated push-button switch, said switch including a body, a plunger extending from the body and electrical contacts, said switch having an operated and non-operated position wherein said operated position provides electrical continuity between said electrical contacts and said non-operated position provides an electrical open circuit between said contacts, said switch being located in the vicinity of the telephone instrument face and mounted within the telephone instrument housing so that said plunger extends through an opening in said face, said opening being in registry with said plunger when said switch is mounted in the telephone.

10. In combination with a telephone instrument of the general type including coin-operated and pay type telephone instruments characterized by transmission network means for connecting the telephone instrument to a telephone subscriber line to send and receive electrical signals representative of audio and call supervision to and from the telephone line and including transducer means for converting the received electrical signals into audio, an amplifier assembly located internally within the telephone instrument housing for controlling the volume of the audio, said amplifier assembly comprising:

input coupling means for coupling the amplifier assembly directly to the telephone transmission network located within the telephone housing to couple received electrical signals from the telephone subscriber line to the amplifier assembly;

circuit means connected to the input coupling means for receiving the electrical signals, said cirucit means including amplifier means for amplifying the magnitude of a received electrical signal in accordance with a predetermined incremental amplification level, said circuit means including dial control circuit means for suppressing the DTMF signals present at the input of said receiving circuit means during the call dialing process when the telephone instrument is arranged for tone dialing;

output coupling means for coupling the amplifier means to the handset receiver transducer to excite the transducer in proportion to the magnitude of said amplified received electrical signal wherein the volume of the audio produced is proportional to the magnitude of the amplified signal, said output coupling means including:

a first output terminal;

an output resistor connected between the output of the amplifier means and first output terminal;

a second output terminal;

said transducer being connected to and across said first and second output terminals, and a first gain resistor coupled between said second output terminal and an electrical ground reference potential, said first gain resistor and said transducer forming a voltage divider network and said first gain resistor having a value selected to produce a signal across said first and second terminals so that said signal has a magnitude to cause the transducer to produce an audio signal having a first volume corresponding to the volume generally produced for a telephone user having a normal hearing sensitivity;

gain control circuit means coupled to said amplifier means for establishing a predetermined number of said incremertal amplification levels, asid gain control circuit means including:

a second gain resistor having one end connected to said second output terminal and its other end connected to a first terminal of a first switching device, said first switching device having a second terminal connected to ground potential and an input terminal for controlling the switching state of the device, said switching device producing a short circuit between its first and second terminals when a voltage potential of the proper polarity is applied to its input terminal and producing a high impedance open circuit between its first and second terminals when the proper polarity voltage potential is removed from its input terminal, said second gain resistor being connected in parallel with said first gain resistor when said first switching device is in its short circuit state whereby the magnitude of the signal appearing across said first and second output terminals is amplified a first predetermined incremental amplification level above said magnitude associated with said first volume and causing said transducer to produce an audio signal having a second volume louder than said first volume;

a third gain resistor having one end connected to said second output terminal and its other end connected to a first terminal of a second switching device, said second switching device having a second terminal connected to ground potential and an input terminal for controlling the switching state of the device, said switching device producing a short circuit between its first and second terminals when a voltage potential of the proper polarity is applied to its input terminal and producing a high impedance open circuit between its first and second terminals when the proper polarity voltage potential is removed from its input terminal, said third gain resistor being connected in parallel with said first gain resistor when said first switching device is in its short circuit state whereby the magnitude of the signal appearing across said first and second output terminals is amplified a second predetermined incremental amplification level above said magnitude associated with said second volume and causing said transducer to produce an audio signal having a third volume louder than said second volume; and said second gain resistor and said third gain resistor being connected in parallel with said first gain resistor when said first switching device and said second switching device are in a short circuit state whereby the magnitude of the signal appearing across said first and second output terminals is amplified a third predetermined incremental amplification level above said magnitude associated with said third volume and causing said transducer to produce an audio signal having a fourth volume louder than said third volume;

amplification level selection means coupled to said gain control circuit means for selecting one of said predetermined number of said incremental amplification levels, each of said amplification levels being associated with a different volume, said amplification selection means including a sequential binary counter coupled to said amplification means, said binary counter having two output terminals and producing a two bit binary coded signal wherein one bit is the LSB and is associated with one output terminal and the other bit is the MSB and is associated with the other output terminal, said counter further being arranged for repetitive counting from a count equal to zero to a count equal to three, said count value corresponding to the number of said incremental amplication levels wherein each count value is associated with a different one of said incremental amplification levels, said LSB output terminal being coupled to the input terminal of said first switching device and the MSB output terminal being coupled to the input terminal of said second switching device, and actuator means coupled to said amplification level selection means, said selection means being sensitive to and responsive to said actuator means for sequentially selecting from said predetermined number of said incremental amplification levels a different one of said number of different amplification levels each time said actuator means is operated, said actuator means comprising a momentarily operated push-button switch, said switch including a body, a plunger extending from the body and electrical contacts, said switch having an operated and non-operated position wherein said operated position provides electrical continuity between said electrical contacts and said non-operated position provides an electrical open circuit between said contacts, said switch being located in the vicinity of the telephone instrument face and mounted within the telephone instrument housing so that said plunger extends through an opening in said face, said opening being in registry with said plunger when said switch is mounted in the telephone.

* * * * *